(12) United States Patent
Nemoto (10) Patent No.: US 7,064,805 B2
(45) Date of Patent: Jun. 20, 2006

(54) EXPOSURE APPARATUS

(75) Inventor: Yoshiji Nemoto, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 68 days.

(21) Appl. No.: 11/008,358

(22) Filed: Dec. 9, 2004

(65) Prior Publication Data

US 2005/0122502 A1 Jun. 9, 2005

(30) Foreign Application Priority Data

Dec. 9, 2003 (JP) .............................. 2003-409962

(51) Int. Cl.
*G03B 27/42* (2006.01)
(52) U.S. Cl. ............................ 355/53; 355/69; 355/71
(58) Field of Classification Search ...................... None
See application file for complete search history.

(56) References Cited

U.S. PATENT DOCUMENTS

| | | | |
|---|---|---|---|
| 5,895,737 A | 4/1999 | McCollough et al. | 430/30 |
| 5,966,202 A | 10/1999 | McCollough | 355/67 |
| 6,013,401 A | 1/2000 | McCollough et al. | 430/30 |
| 6,097,474 A | 8/2000 | McCollough et al. | 355/69 |
| 6,292,255 B1 | 9/2001 | McCollough | 355/67 |

FOREIGN PATENT DOCUMENTS

| | | |
|---|---|---|
| JP | 10-340854 A | 12/1998 |
| JP | 2001-244183 A | 9/2001 |

*Primary Examiner*—D. Rutledge
(74) *Attorney, Agent, or Firm*—Morgan & Finnegan LLP (57) ABSTRACT

A scanning exposure apparatus for transferring a pattern of an original onto a substrate, includes a flexible blade, arranged between a light source and the original, for defining a width of an illumination area on the original in a scan direction, a first drive system to move the blade in the scan direction at a first position in the illumination area in an orthogonal direction that is orthogonal to the scan direction, and a second drive system to move the blade in the scan direction at a second position outside the illumination area in the orthogonal direction, wherein the first and second positions are arranged so that a position of the blade in the scan direction is maintained still within a predetermined tolerance, at an end position of the illumination area in the orthogonal direction.

10 Claims, 11 Drawing Sheets

EXPOSURE APPARATUS

BACKGROUND OF THE INVENTION

The present invention relates generally to an exposure apparatus, and more particularly to an exposure apparatus used to fabricate various devices including semiconductor chips such as ICs and LSIs, display devices such as liquid crystal panels, sensing devices such as magnetic heads, and image pick-up devices such as CCDs, as well as fine patterns used for micromechanics. The present invention is suitable, for example, for a scanning exposure apparatus that has an arc-shaped exposure area.

A reduction projection exposure apparatus has been conventionally employed which uses a projection optical system to project a circuit pattern formed on a mask or a reticle, which are referred to as an original in this application, onto a wafer, etc. to transfer the circuit pattern, in manufacturing such a fine semiconductor device as a semiconductor memory and a logic circuit in photolithography technology.

The projection exposure apparatuses have been required to enlarge the transfer area and improve the resolution so as to manufacture highly integrated semiconductor devices. Accordingly, the current main stream replaces a step and scan manner that exposes a reduced exposure image on a reticle at one time by sequentially moving each exposure area on the wafer to an exposure area of the projection optical system with a slit scan manner or a step and scan manner that enlarges the transfer area by synchronously scanning the reticle and the wafer.

Since the slit-scan projection exposure apparatus scan-exposes each exposure area on the wafer by using a rectangular opening that is shorter than a length in the scan direction of the exposure area, the accumulated exposure dose of the rectangular opening should be made constant for all the points on the wafer and the accumulated exposure dose should be controlled for each exposure area. When the accumulated exposure dose differs for each point on the wafer, the uneven accumulated exposure dose for each exposure area (or the uneven exposure) deteriorates the resolution.

Figure 7:
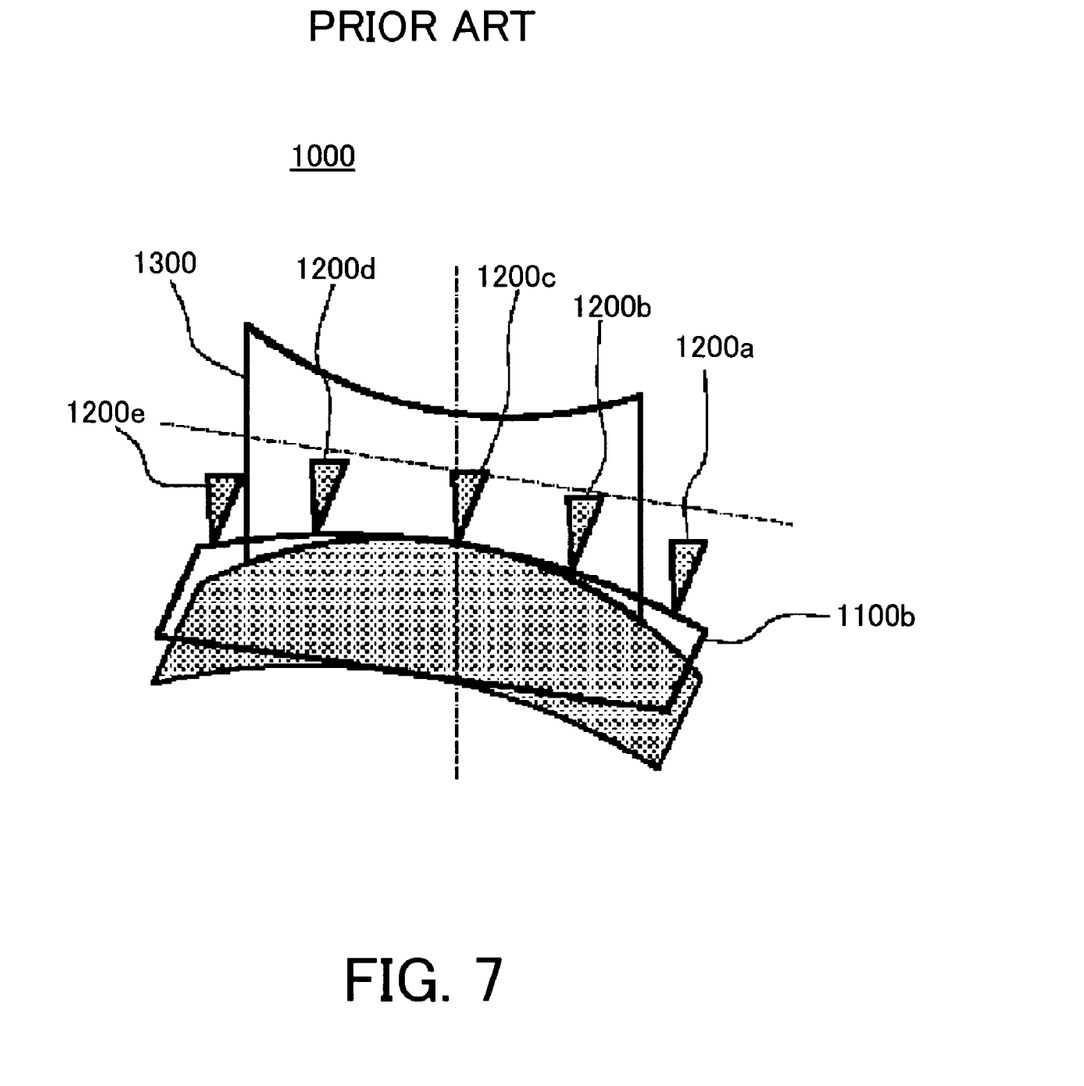
FIG. 7 is a view for explaining a structure of a conventional exposure area shaping means.

Accordingly, various exposure apparatuses have been proposed to correct the uneven exposure by arranging, in place optically conjugate with the reticle, an exposure area shaping means for regulating an opening width according to the exposure non-uniformity. See, for example, Japanese Patent Applications, Publications No. 2001-244183 and 10-340854. For example, an exposure area shaping means 100 is configured to correct the uneven exposure dose irradiated on the wafer by a flexible blade 1100 that is obliquely attached to the optical axis of the exposure light, as shown in FIG. 7. A pair of blades 1100 are provided opposite to each other with respect to the optical axis, although FIG. 7 shows only one of the blades 1100. The blade 1100b is deformed to an arbitrary shape and a shape of the exposure area 1300 is determined by pushing and pulling tops 1200a and 1200e provided at outer correcting positions, tops 1200b and 1200d provided at inner correcting positions, and a top 1200c provided at center correcting position. The tops 1200a and 1200e are provided around the exposure area 1300 so as to maintain the uneven exposure around the exposure area 1300 when only the tops 1200b and 1200c are pushed and pulled so as to correct the uneven exposure near the inner correcting position. Here, FIG. 7 is a view for explaining a structure of the conventional exposure area shaping means 1000.

Figure 8:
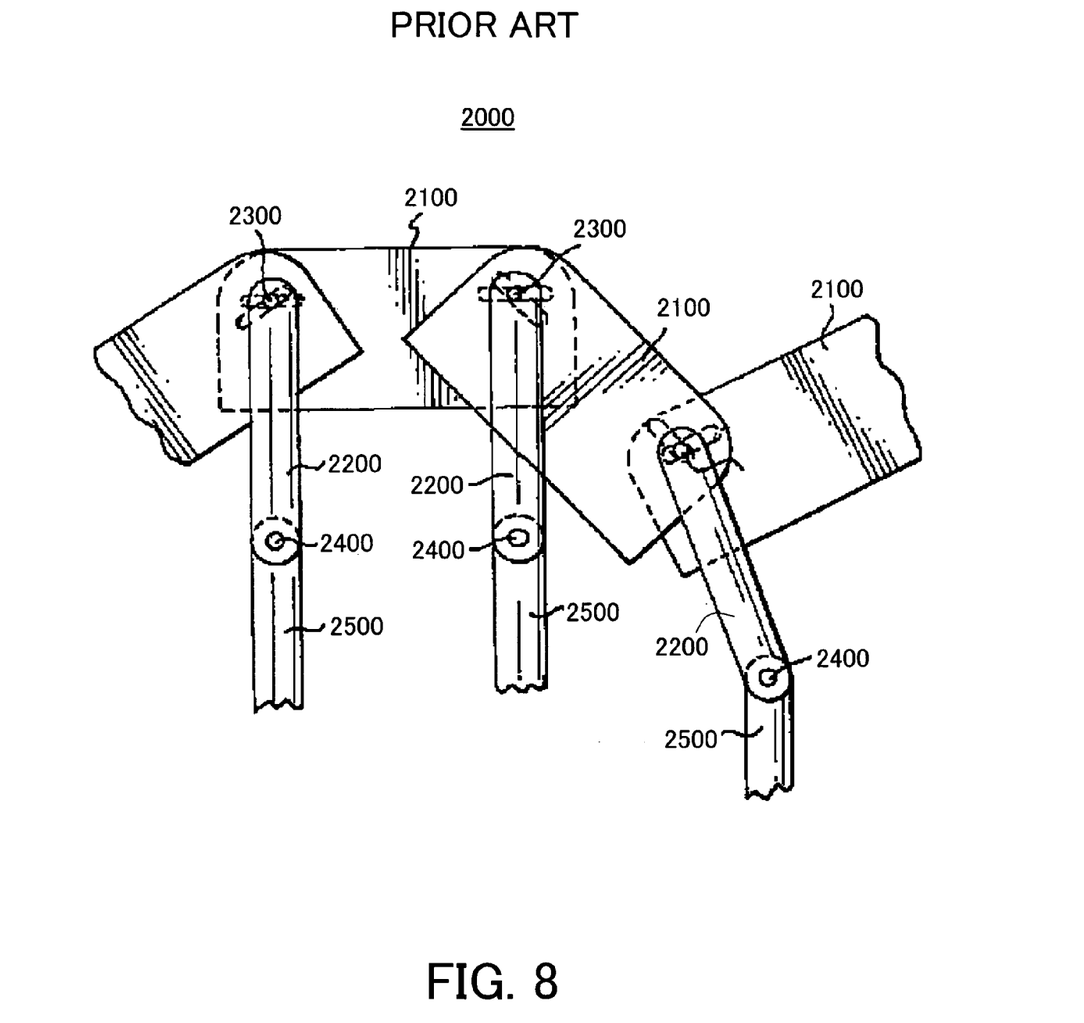
FIG. 8 is a view for explaining a structure of another conventional exposure area shaping means.

Another exposure area shaping means 200 is proposed as shown in FIG. 8, to correct the uneven exposure dose irradiated on the wafer by using plural blades 2100 attached to plural combination links 2200. The blade 2100 is connected to the combination link 2200 via a blade pivot pin 2300, and the combination link 2200 is connected to a push rod 2500 via a link pivot 2400. The exposure area shaping means 2000 determines a shape of the exposure area by pushing and pulling the push rod 2500 and by moving each blade 2100 to an arbitrary position via the combination link 2200. Here, FIG. 8 is a view for explaining a structure of the conventional exposure area shaping means 2000.

In view of the energy efficiency, the chromatic aberration and the environmental sensitivity, a recently developed slit-scan exposure apparatus includes a catadioptric optical system as a projection optical system that includes plural mirrors and lenses, and defines the exposure area as an arc opening shape. Therefore, the exposure area shaping means needs to correct the uneven exposure by locally changing the opening width of the arc exposure area. However, when the above conventional exposure area shaping means is applied to the exposure area that has an arc-shaped opening, pushing and pulling of the inner correcting position, for example, would result in changes of the outer correcting position.

Figure 9:
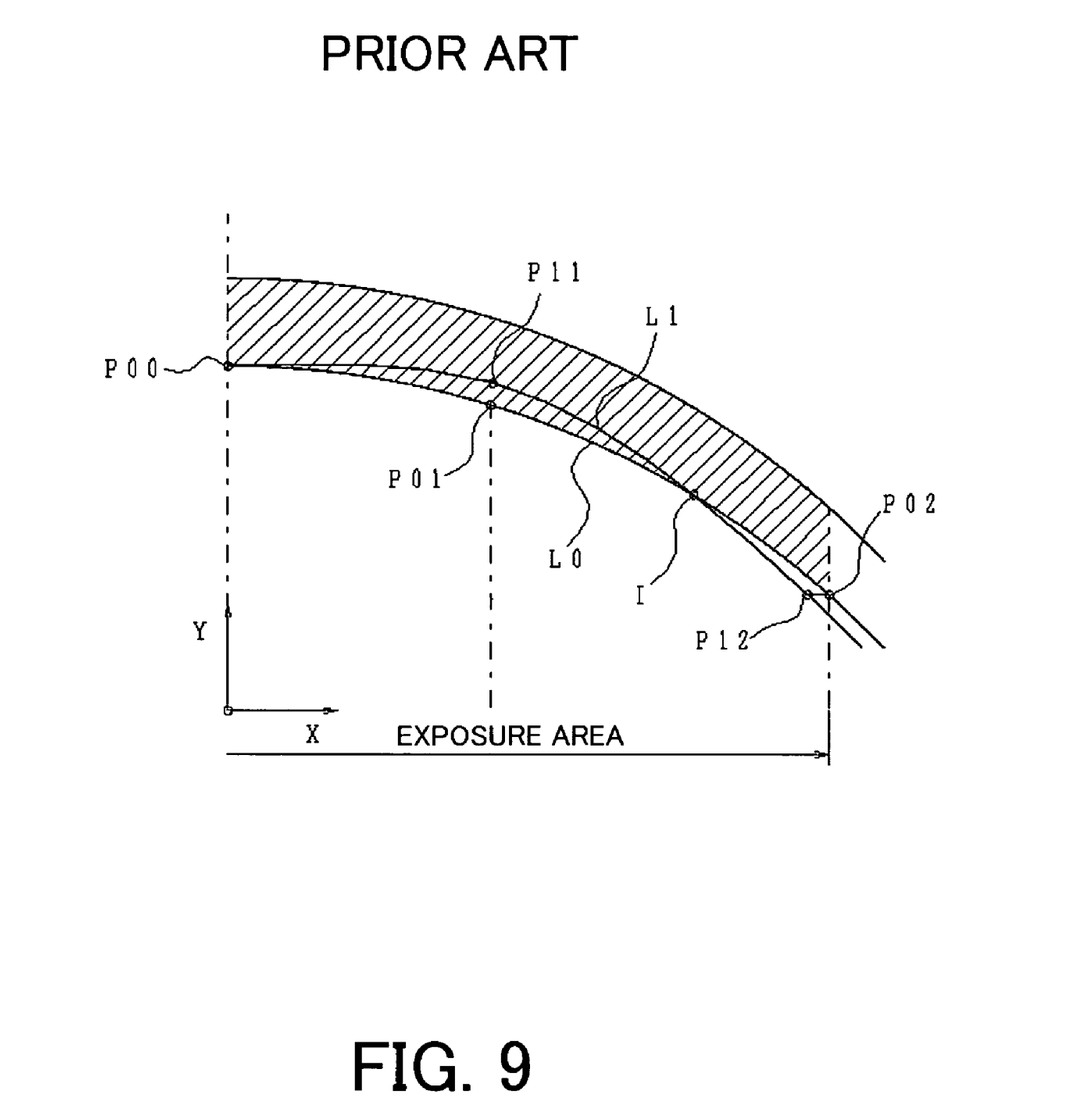
FIG. 9 is a plane view showing an end surface shape of an arc-shaped metal plate having a pushing/pulling mechanism in the conventional exposure area shaping means.

FIG. 9 is a plane view showing an end surface shape of an arc-shaped metal plate having a pushing/pulling mechanism in the conventional exposure area shaping means. Since FIG. 9 is of bilateral symmetry, the left side is omitted. L0 is an end surface shape at the standard state. P00 is a center position at which the pushing/pulling mechanism is attached. P01 is an inner correcting position at which the pushing/pulling mechanism is attached. P02 is an outer correcting position at which the pushing/pulling mechanism is attached. The outer correcting position P02 is arranged around the exposure area.

For example, when the inner correcting position P01 is pushed and pulled from the standard state L0 in order to correct the uneven exposure, the expansion and contraction of the minute deformations of the arc-shaped metal plate is negligible. Therefore, the correcting position P01 rotates around the center position P00, and turns to a corrected position P11. On the other hand, the outer correcting position P02 turns to a corrected position P12 so that a distance between the inner and outer corrected positions P11 and P12 is equal to a distance between the correcting positions P01 and P02. More specifically, the outer correcting position P02 rotates around the link pivot pin, and turns to the corrected position P12 that offsets from the correcting position P02 in the X direction, since the movement of the minute deformation in the Y direction is negligible. Thus, the end shape L0 at the standard state deforms, and turns to the end surface shape L1 after the deformation.

When the inner correcting position P01 is pushed and pulled, the state becomes as if the corrected position P02 is pushed and pressed, as apparent from FIG. 9, although the outer correcting position P02 is not pushed or pulled. When the inner correcting position P01 is pushed and pulled in order to correct the uneven exposure up to the desired accuracy, the uneven exposure at the correcting position P02 or around the exposure area deteriorates, since the outer correcting position P02 is located around the exposure area. It is conceivable that the outer correcting position P02 is pushed and pulled so as to correct the uneven exposure around the exposure area, but the throughput deteriorates and the uneven exposure is not always corrected to the desired accuracy.

Figure 10:
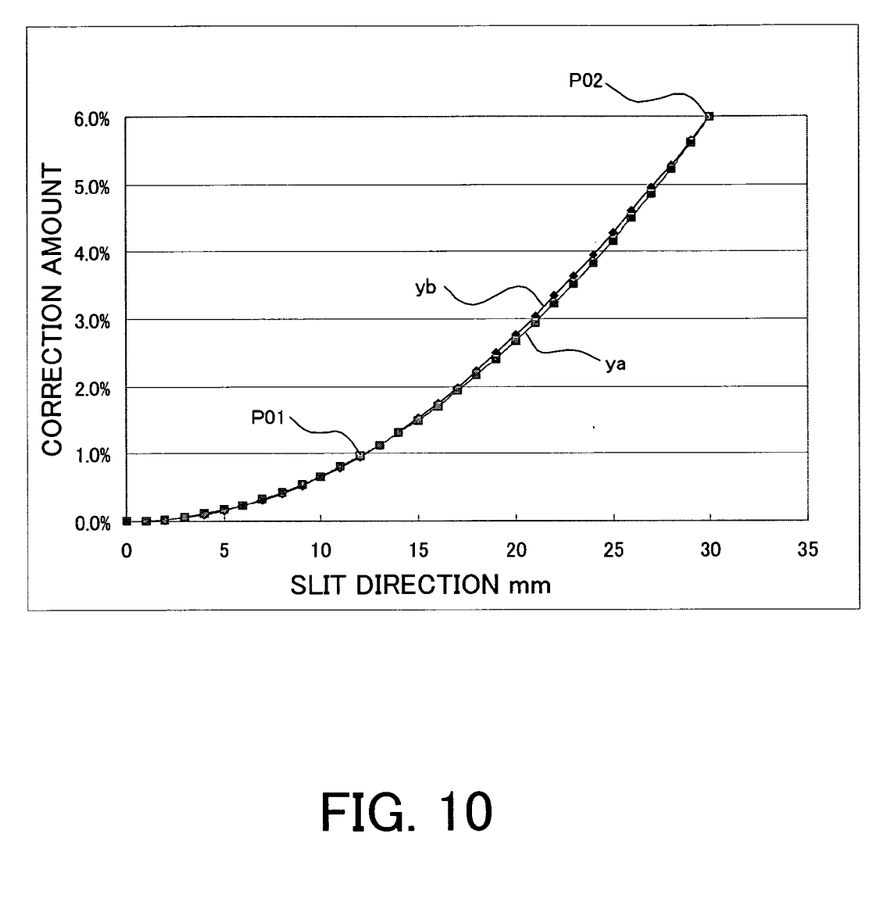
FIG. 10 is a graph showing a relationship between a slit direction and a corrected amount when the uneven exposure is corrected by 6%.

While it is known that the opening width of the exposure area preferably forms an approximate quadratic curve, the conventional exposure area shaping means shapes the opening by bending the arc-shaped metal plate and the opening shape of the exposure area becomes a cubic curve from the beam deformation theory. Even when the arc-shaped metal plate is pushed and pulled so that the uneven exposure becomes minimum at the inner and outer correcting positions P01 and P02, the uneven exposure at an intermediate position between the inner and outer correcting positions P01 and P02 cannot be corrected completely. FIG. 10 is a graph showing a relationship between the slit direction and the corrected amount, when the uneven exposure is corrected to 6%.

Referring to FIG. 10, the ideal curve ya is a quadratic curve expressed by Equation 1 below:

$$ya = Ax^2 \quad \text{[EQUATION 1]}$$

The actual corrected curve yb is a cubic curve from the beam deformation theory, and expressed by Equation 2 below, where E is a modulus of longitudinal elasticity, i is a second moment, L is an outer correcting position, and $L_1$ is an inner correcting position:

$$yb = P^2/6Ei \times (2L^3 - 3L^2 \times (L-x) + (L-x)^3) - P_1/6Ei \times (2L_1^3 - 3L_1^2 \times (L_1-x) + (L_1-x)^3) \quad \text{[EQUATION 2]}$$

where $0 < x < L_1$; and $$yb = -P^2/6Ei \times (2L^3 - 3L^2 \times (L-x) + (L-x)^3) + P_1 L_1^3/3Ei \times P_1 \times L_1^2 \times (L_1-x)/2Ei$$

where $L_1 < x < L$

Figure 11:
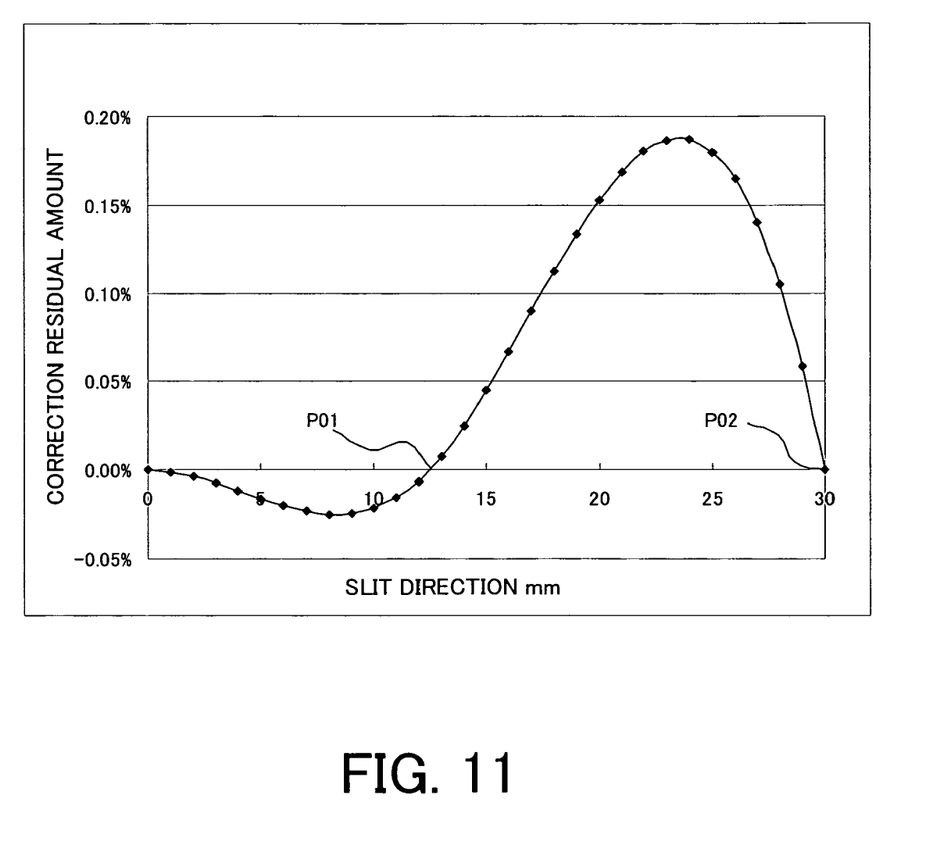
FIG. 11 is a graph showing a corrective residual amount.

FIG. 10 is a graph of weighting coefficients $P_1$ and $P_2$ so that the corrected curve yb accords with an ideal curve ya at the inner and outer correcting positions P01 and P02. It is understood from FIG. 10 that yb do not accord with ya between the inner and outer correcting positions P01 and P02, and the uncorrectable residue occurs. FIG. 11 is a graph showing a corrective residue amount, i.e., yb−ya, calculated from the graph shown in FIG. 10, and it is understood that the corrective residue amount of 0.19% occurs. This corrective residue amount is not negligible from the tolerance of the uneven exposure required for the recent highly integrated semiconductor devices.

BRIEF SUMMARY OF THE INVENTION

Accordingly, it is an exemplary object of the present invention to provide a scanning exposure apparatus, which can shape an exposure area with high precision.

A scanning exposure apparatus according to one aspect of the present invention for transferring a pattern of an original onto a substrate, said apparatus includes a flexible blade, arranged between a light source and the original, for defining a width of an illumination area on the original in a scan direction, a first drive system to move said blade in the scan direction at a first position in the illumination area in an orthogonal direction that is orthogonal to the scan direction, and a second drive system to move said blade in the scan direction at a second position outside the illumination area in the orthogonal direction, wherein the first and second positions are arranged so that a position of said blade in the scan direction is maintained still within a predetermined tolerance, at an end position of the illumination area in the orthogonal direction.

A device manufacturing method according to another aspect of the present invention includes the steps of transferring a pattern of an original to a substrate using the above scanning exposure apparatus, and developing the substrate to which the pattern has been transferred.

Other objects and further features of the present invention will become readily apparent from the following description of the preferred embodiments with reference to the accompanying drawings.

DETAILED DESCRIPTION OF THE PREFERRED EMBODIMENTS

Referring now to the accompanying drawings, a description will be given of an exposure apparatus according to one aspect of the present invention. Here, FIG. 1 is a schematic block diagram of a structure of the exposure apparatus 1 according to one aspect of the present invention.

Figure 1:
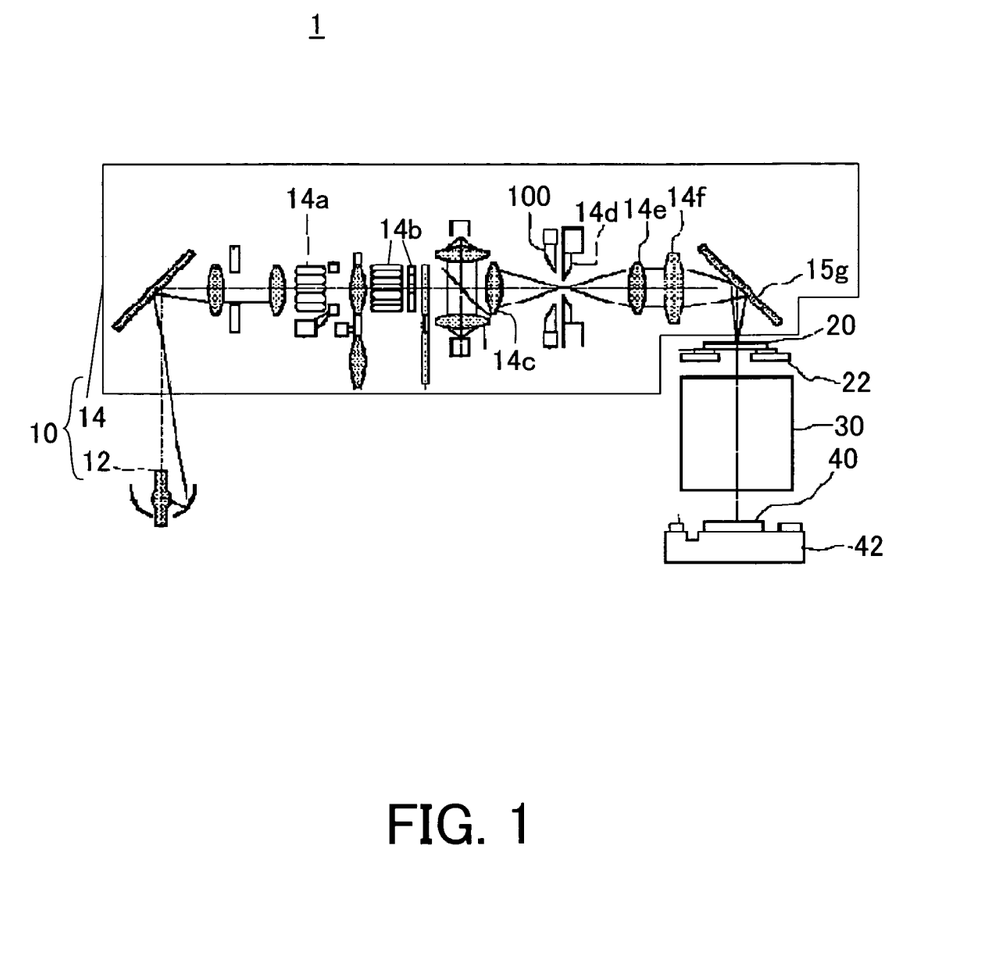
FIG. 1 is a schematic block diagram of a structure of an exposure apparatus according to one aspect of the present invention.

The exposure apparatus 1 includes, as shown in FIG. 1, an illumination apparatus 10, a reticle stage 22 mounted with a reticle 20, a projection optical system 30, and a wafer stage 42 mounted with an object 40 to be exposed.

The exposure apparatus 1 is a projection exposure apparatus that exposes a circuit pattern on the reticle 20 onto the object 40 in a step-and-scan manner. Such an exposure apparatus is suitable for a sub-micron or quarter-micron lithography process.

The illumination apparatus 10 illuminates the reticle 20, on which a circuit pattern to be transferred is formed, and includes a light source 12 and an illumination optical system 14.

The light source 12 includes, for example, a laser. The laser may be pulsed laser such as an ArF excimer laser with a wavelength of approximately 193 nm, a KrF excimer laser with a wavelength of approximately 248 nm, a $F_2$ laser with a wavelength of approximately 157 nm, etc. A kind of laser, the number of laser units, and a type of light source section is not limited.

The illumination optical system 14 is an optical system that illuminates the reticle 20, and includes a pair of optical integrators 14a and 14b, a first relay lens 14c, a correction apparatus 100, a movable blind 14d, a second relay lens 14e, a condenser lens 14f, and a mirror 14g in this embodiment. The illumination optical system 14 can use any light whether it is axial or non-axial light.

The optical integrators 14a and 14b superimpose (or average) the image-surface light intensity of the illumination light emitted from the light source 12. The resultant light is incident, after the first relay lens 14c, upon the correction apparatus 100 that uses two blades to implement an exposure area shaping function. The correction apparatus 100 is a mechanical field stop that encloses an arc aperture, and is located at a Fourier transformation surface of the optical integrator 14b and optically conjugate with the reticle 20. The movable blind 14d is located near the correction apparatus 100. The movable blind 14d is a field stop that encloses a rectangular opening using, for example, four knife-edges, and the rectangular opening defines a shape of an illumination area on the reticle 20. Thus, the illumination light defined by the correction apparatus 100 and the movable blind 14d illuminates the illumination area on the reticle 20 at a uniform light intensity distribution via the second relay lens 14e, the condenser lens 14f and the mirror 14g.

Figure 2:
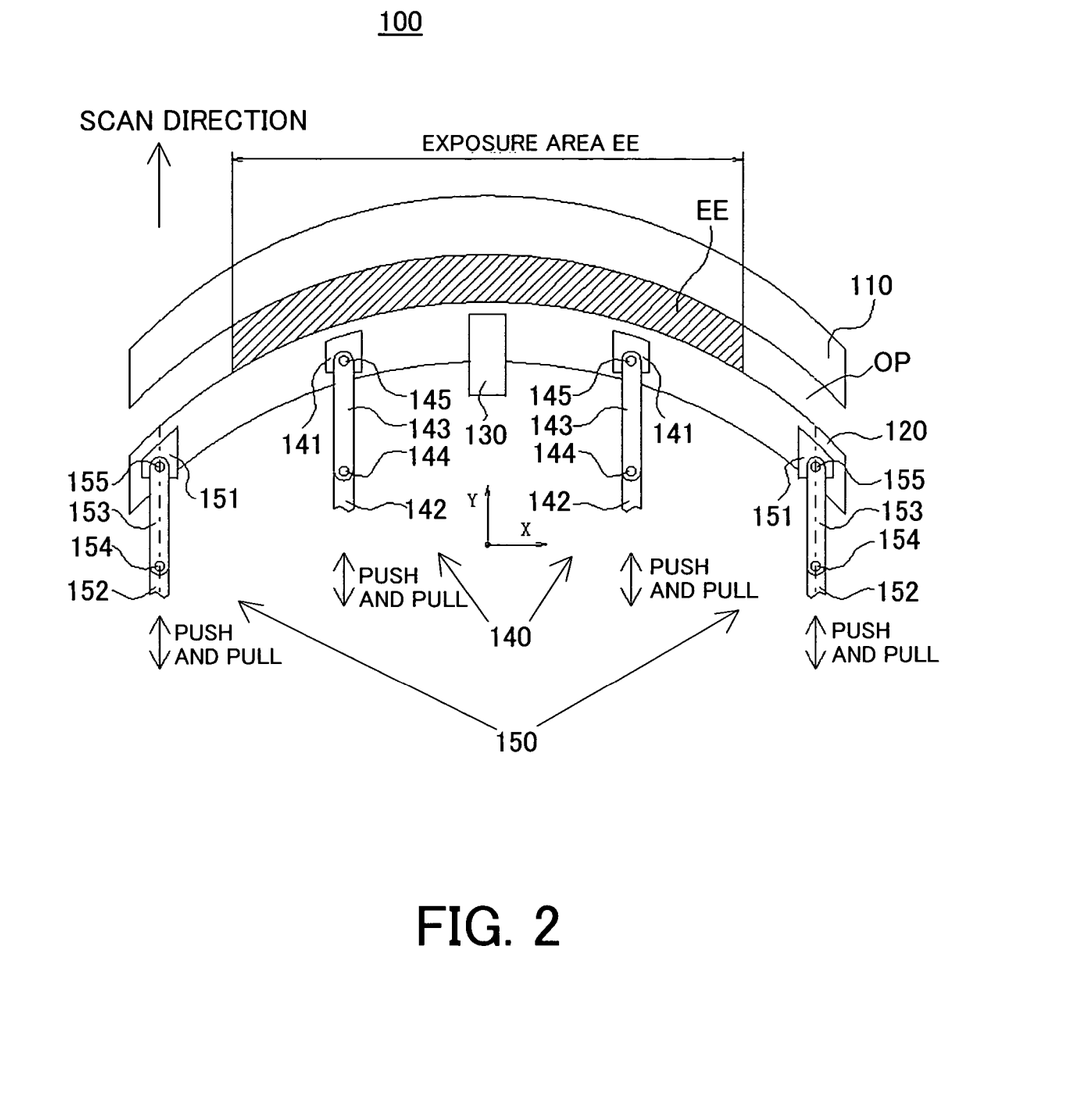
FIG. 2 is an enlarged plane view of a structure of a correction apparatus shown in FIG. 1.

The exposure apparatus 1 is characterized in the illumination apparatus 10, more particularly in the correction apparatus 100. A description will now be given of the inventive correction apparatus 100. FIG. 2 is a plane view that enlarges a structure of the correction apparatus 100 shown in FIG. 1.

The correction apparatus 100 serves to adjust an opening shape of the exposure area, and to correct the uneven exposure dose that would otherwise occur on the exposure area on the object 40, when the reticle 20 and the object 40 are relatively scanned and exposed, as described later. The correction apparatus 100 includes, as shown in FIG. 2, a fixed blade 110 made of a flexible thin metal member that is obliquely provided to the optical axis of the illumination light, and a movable blade 120 made of a flexible thin metal member that is obliquely provided to the optical axis of the illumination light. The correction apparatus 100 defines the exposure dose that reaches the exposure area EE through the opening OP formed by the fixed blade 110 and movable blade 120 (or the illumination light that passes through the opening OP). The fixed blade 110 and the movable blade 120 form the arc-shaped opening OP in this embodiment, and the resultant exposure area EE has an arc shape.

The correction apparatus 100 includes a fixing means 130, a pair of first opening width varying means 140, and a pair of second opening width varying means 150. The fixing means 130 fixes a position of the variable blade 120, and is provided at a position of the movable blade 120 corresponding to the center of the opening OP. The pair of first opening width varying means 140 are arranged wit respect to the fixing means 130 at the position of the movable blade, push and pull the movable blade 120, and locally vary the opening width of the opening OP in the scan direction. The pair of second opening width varying means 150 are located outside the exposure area EE, and at the position of the movable blade 120 corresponding to the outside of the pair of first opening width varying means 140 in the direction orthogonal to the scan direction, and locally vary the opening width of the opening OP in the scan direction.

The first and second opening width varying means 140 and 150 include, for example, tops 141 and 151 locally attached to the movable blade 120 in the direction orthogonal to the scan direction, push rods 142 and 152, combination links 143 and 153, link pivot pins 144 and 154, and blade pivot pins 145 and 155. The movable blade 120 moves via the combination links 143 and 153 when an actuator or the like pushes and pulls the push rods 142 and 152, and locally varies the opening width of the opening OP (exposure area EE) in the scan direction. Thus, the uneven exposure is corrected. The fixing means 130 is implemented, for example, as a top. If the fixing means 130 includes the combination link or the like, an in-plane position of the movable blade 120 is not determined and thus the fixing means 130 does not include the combination link. As discussed above, the top 151 of the second opening width varying means 150 is arranged at the movable blade 120 outside the exposure area EE in the direction perpendicular to the scan direction.

Figure 3:
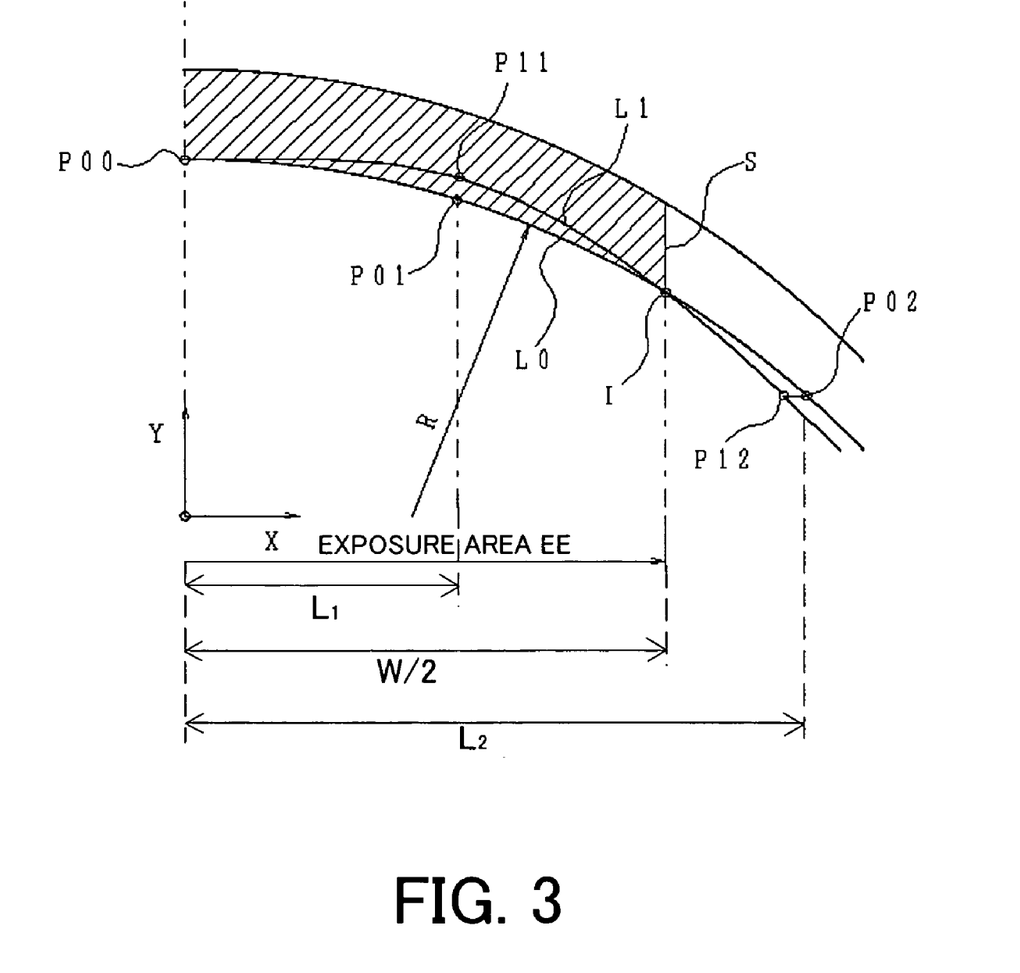
FIG. 3 is a plane view showing a fixed blade and a variable blade shown in FIG. 2.

FIG. 3 is a plane view showing end surface shapes of the fixed blade 100 and the variable blade 120 (or the shape of the opening OP) in the correction apparatus 100 shown in FIG. 2. Since FIG. 3 is of bilateral symmetry, the left side is omitted. L0 is an end surface shape of the variable blade 120 at the standard state. P00 is a center position at which the fixing means 130 is attached. P01 is an inner correcting position at which the first opening width varying means 140 is attached. P02 is an outer correcting position at which the second opening width varying means 150 is attached. Since the second opening width varying means 150 is provided outside the exposure area EE, the correcting position P02 is located outside the exposure area EE.

For example, when the inner correcting position P01 is pushed and pulled from the end surface shape L0 of the standard state in order to correct the uneven exposure, the expansion and contraction of the minute deformation of the arc-shaped metal plate is negligible. Therefore, the correcting position P01 rotates around the center position P00, and turns to a corrected position P11. On the other hand, the outer correcting position P02 turns to a corrected position P12 so that a distance from the inner corrected position P11 is equal to a distance between the correcting positions P01 and P02. More specifically, the outer correcting position P02 rotates around the link pivot pin 154, and turns to the corrected position P12, since the movable blade 120 can be considered to move only in the X direction in the minute deformation, and the movement in the Y direction is negligible. Thus, the variable blade 120 deforms from the end surface shape L0 at the standard state and turns to the end surface shape L1 after the deformation.

An intersection between the end surface shape L0 at the standard state and the end surface shape L1 after the deformation is a fixed point I even when the inner correcting position P01 is pushed and pulled. The (fixed) position of the fixed point I is located at the middle of the inner correcting position P01 (a position of the first opening width varying means 140) and the outer correcting position P02 (a position of the second opening width varying means 150). Even when the inner correcting position P01 is pushed and pulled, the opening width of the opening OP and the uneven exposure do not change.

Accordingly, the instant embodiment arranges the outer correcting position P02 (or the second opening width means 150) so that the fixed point I accords with an end S in the direction perpendicular to the scan direction of the exposure area EE. Due to this arrangement, the uneven exposure does not deteriorate around the exposure area EE (especially at the end S) and the resolution can be maintained, even when the inner correcting position P01 is pushed or pulled in order to correct the uneven exposure up to the desired accuracy.

The position of the fixed position I is uniquely determined from the radius R of the arc-shaped exposure area EE, the position of the inner correcting position P01 (a position of the first opening width varying means 140) and the position of the outer correcting position P02 (a position of the second opening width varying means 150).

First, the positions of the inner and outer correcting positions P01 and P02 are obtained. Suppose an origin is a center of the arc-shaped exposure area EE having the radius R, and coordinates of the center position P0, correcting positions P01 and P02, the corrected positions P11 and P12 are defined as P00 (P00x, P00y), P01 (P01x, P01y), P02 (P02x, P02y), P11(P11x, P11y), P12(P12x, P12y), respectively.

Since a distance between the center position P0 and the corrected position P11 is equal to that between the center position P0 and the correcting position P01, the following Equation 3 is met:

$$(P01x-P00x)^2+(P00y-P01y)^2=(P11x-P00x)^2+(P00y-P11y)^2 \quad \text{[EQUATION 3]}$$

Therefore, x coordinate P11x of the inner corrected position P11 is expressed by Equation 4 below:

$$P11x = P00x + \sqrt{(P01x-P00x)^2+(P00y-P01y)^2-(P00y-P11y)^2} \quad \text{[EQUATION 4]}$$

Since the minute deformation state is assumed, the y coordinate P11y of the inner corrected apposition P11 of is expressed by Equation 5 below, where a pushing/pulling amount in the Y direction Dy is set to 0.1:

$$P11y=P01y+Dy \quad \text{[EQUATION 5]}$$

Similarly, since a distance between the corrected positions P11 and P12 is equal to that between the correcting positions P01 and P02, the x coordinate P12x of the outer corrected position P12 is expressed by Equation 6 below:

$$P12x = P11x + \sqrt{(P02x-P01x)^2+(P01y-P02y)^2-(P11y-P12y)^2} \quad \text{[EQUATION 6]}$$

Since the outer correcting position P02 moves only in the X direction, the y coordinate P12y of the outer corrected position P12 is expressed by Equation 7 below:

$$P12y=P02y \quad \text{[EQUATION 7]}$$

Next, a general formula of the end surface shape L1 after the deformation is calculated. The deforming amount in the minute deformation state of the variable blade 120 is negligible. Therefore, the end surface shape L1 after the deformation is regarded as an arc that has the radius R and passes two corrected positions P11 and P12 between the inner corrected position P11 and the outer corrected position P12. Accordingly, when the center coordinate of the end surface shape L1 after the deformation is defined as G1(G1x, G1y), Equation 9 below that is made by substituting the coordinates of the coordinates of the corrected positions P11 and P12 for the general formula expressed by Equation 8 below:

$$(X-G1x)^2+(Y-G1y)^2=R^2 \quad \text{[EQUATION 8]}$$

$$(P11x-G1x)^2+(P11y-G1y)^2=R^2;$$

$$(P12x-G1x)^2+(P12y-G1y)^2=R^2 \quad \text{[EQUATION 9]}$$

Equation 10 below is met by solving the simultaneous Equations 9, and calculating the coordinate G1 at the center of the end surface shape L1 after the deformation, where $J=(P11x^2+P11y^2-P12x^2-P12y^2)/2/(P11y-P12y)$, $A=1+H^2$, $H=-(P11x-P12x)/(P11y-P12y)$, $B=-2\times(P11x+H\times(P11y-J))$, and $C=P11x^2+(P11y-J)^2-R^2$.

$$G1x=(-B-\sqrt{B^2-4\times A\times C}/2/A);$$

$$G1y=J-H\times G1x \quad \text{[EQUATION 10]}$$

Next, the coordinate I(Ix, Iy) of the fixed point I is calculated. Since the fixed point I is an intersection between the end surface shape L0 at the standard state and the end surface L1 after the deformation, the following Equation 11 is met by substituting the coordinate of the fixed point I for respective circles' general formulas:

From the L0's general formula, $Ix2+Iy2=R2$;

From the L1's general formula, $(Ix-G1x)^2+(Iy-G1y)^2=R^2$ [EQUATION 11]

Equation 12 is obtained by solving the simultaneous Equations 11 and calculating the coordinate of the fixed point I, where $D=1+G1x^2/G1y^2$, $E=-G1x\times(G1x^2+G1y^2)/G1y^2$, and $F=((G1x^2+G1y^2)/2/G1y)^2-R^2$.

$$Ix=(-E+\sqrt{(E^2-4\times D\times F)})/2/D \quad \text{[EQUATION 12]}$$

Thus, the coordinate of the fixed point I is uniquely determined from the radius R of the arc-shaped exposure area EE, and the coordinates of the inner and outer correcting positions P01 and P02. In other words, it is possible to accord a position of the fixed point I with the end S of the exposure area EE by properly setting one of the radius R of the arc-shaped exposure area EE, and the coordinates of the inner and outer correcting positions P01 and P02.

Here, the size and radius R of the arc-shaped exposure area EE is determined from the design value of the projection optical system 30, and it is impossible to accord a position of the fixed point I with the end S of the exposure area EE if the outer correcting position P02 is arranged inside the exposure area EE. Therefore, the outer correcting position P02 is set so that the position of the fixed point I accords with the end S of the exposure area EE.

Due to the structural restraints, the position of the fixed point I cannot strictly accord with the end S of the exposure area EE. Therefore, the "accordance of the position of the fixed point I with the end S of the exposure area EE" means "the state where the fixed point I completely accords with the end S of the exposure area EE", and "the state that contains errors as a result of that the fixed point I is attempted to completely accord with the end S of the exposure area EE".

The outer correcting position P02 is calculated by a concrete numerical value for Equations 3 to 12 so that the fixed point I accords with the end S of the exposure area EE. The x coordinate P02x of the outer correcting position P02 becomes P02x=36 mm where the radius R=45 mm of the arc-shaped exposure area EE, the x coordinate P01x=12.5 mm of the inner correcting position P01, and the exposure area EE=60 mm. A ratio T2 of a varying amount of the uneven exposure at the end S of the exposure area EE relative to the correcting amount of the uneven exposure at the correcting position P01 is calculated with these set values, when the inner correcting position P1 is pushed and pulled.

The following Equation 13 is met, where S0(S0x, S0y) is defined as a coordinate of the end S of the exposure area EE of the end surface shape L0 at the standard state, and S1 is defined as a coordinate of the end S of the exposure area EE of the end surface shape L1 after the deformation:

From the L0's general formula, $S0x^2+S0y^2=R^2$;

From the L1's general formula, $(S1x-G1x)^2+(S1y-G1y)^2=R^2$  [EQUATION 13]

Therefore, the ratio T2 of the varying amount of the uneven exposure at the end S of the exposure area EE is expressed by the following Equation 14:

$T2=(S1y-S0y)/Dy=(\sqrt{R^2-(S1x-G1x)^2}+G1y-\sqrt{R^2-S0x^2})/Dy$  [EQUATION 14]

A description will now be given of the residual amount Qn of the uneven exposure after the number N of corrections of the uneven exposure. The sequence for correcting the uneven exposure includes the steps of:

1) pushing and pulling the outer correcting position P02 and correcting the uneven exposure at the end S of the exposure area EE;

2) pushing and pulling the outer correcting position P01 and correcting the uneven exposure at the inner correcting position P01 of the exposure area EE; and 3) repeating the 1) and 2) steps until the uneven exposure drops down to the tolerance. Of course the order of the 1) and 2) steps may be inverse.

Therefore, the residual amount Qn of the uneven exposure is expressed by the following Equation 15 after the number N of corrections of the uneven exposure, where T1 is a ratio of the varying amount of the uneven exposure at the inner correcting position P01 relative to the varying amount of the uneven exposure at the end S of the exposure area EE.

$Qn=Q1\times(T1\times T2)^{(N-1)/2}$  [EQUATION 15]

Q1 is a residual amount of the uneven exposure after one correction, and is about 7% when the initial uneven exposure is assumed to be 6%. T1 is constant irrespective of the position of the outer correcting position P02, and is about 0.2. As apparent from Equation 15, in an attempt to make the residual amount Qn of the uneven exposure below the tolerance Q of the uneven exposure where T2 is large, the number N of corrections of the uneven exposure increases and the throughput decreases. For example, for the number N of corrections of the uneven exposure N≦3, T2≦0.14 for the tolerance Q of the uneven exposure Q=0.2. In other words, the ratio T2 of the varying amount of the uneven exposure is about 14%, the uneven exposure is corrected without lowering the throughput. It is practicably viable to arrange the outer correcting position P02 or the second opening width varying means 150 within a range and to reduce the ratio T2 of the varying amount of the uneven exposure at the end S of the exposure area EE.

For example, when the x coordinate P02x=36±4 mm of the outer correcting position P02, the ratio T2 of the varying amount of the uneven exposure is smaller than about 14%, the outer correcting position P02 is arranged 4% to 16% outside the exposure area EE. As a result, the varying amount of the uneven exposure at the end S of the exposure area EE can be maintained below the tolerance, even when the inner correcting position P01 is pushed and pulled in order to correct the uneven exposure up to the desired accuracy.

In this case, the second opening width varying means 150 is arranged so that the following relational Equation 16 is met, where W is a width of the exposure area EE in the direction perpendicular to the scan direction, L1 is a distance between the center of the exposure area EE and the correcting position P01 (or the position of the first opening width varying means 140), and L is a distance between the center of the exposure area EE and the correcting position P02 (or the position of the second opening width varying means 150):

0.54W≦L≦0.66W 0.20W≦L1≦0.25W  [EQUATION 16]

The ratio T2 of the varying amount of the uneven exposure is simply expressed by the following Equation 17 by substituting the above set values for Equation 14, where the position of the fixed point I (the position is positive in a direction outside the exposure area EE) is defined as U relative to the end S of the exposure area EE:

$T2=0.08U^2-0.05U$  [EQUATION 17]

About −1.05<U<about 1.67 provides T2≦0.14. When the reference width of the exposure area EE is set to 60 mm, a range of U is between about −1.8% and about 2.8%. The offset amount equal to or smaller than 2.8% (or 1.8%) falls within the tolerance. Therefore, the offset amount between the fixed point I and the end S of the exposure area EE is preferably 2.8%, more preferably 1.8% of the width of the exposure area EE. This offset amount is preferably smaller than 5% even when the throughput is sensitive to the uneven exposure dose due to the types of the exposure apparatus and the resist.

The residula amount Qn of the uneven exposure may be replaced with the following Equation 18 by substituting Equation 17 for Equation 15:

$Qn=7\times(0.016\times U^2-0.01\times U)^{(N-1)/2}$  [EQUATION 18]

If the residual amount Qn of the uneven exposure can be regarded as the tolerance Q of the uneven exposure, the tolerance range of the position of the fixed point I is determined once the tolerance of the uneven exposure and the number of corrections N are given.

A description will be given of the corrective residual amount. FIGS. 10 and 11 arrange the outer corrective position around the exposure area (in particular, at the end of the exposure area), and the corrective residual amount is calculated when the corrected curve accords with the ideal curve at the inner and outer correcting positions. Since the present invention sets the outer correcting position P02 outside the exposure area, the corrective residual amount is calculated when the corrected curve yb accords with the ideal curve ya at the inner correcting position P01 and the end S of the exposure area EE.

Figure 4:
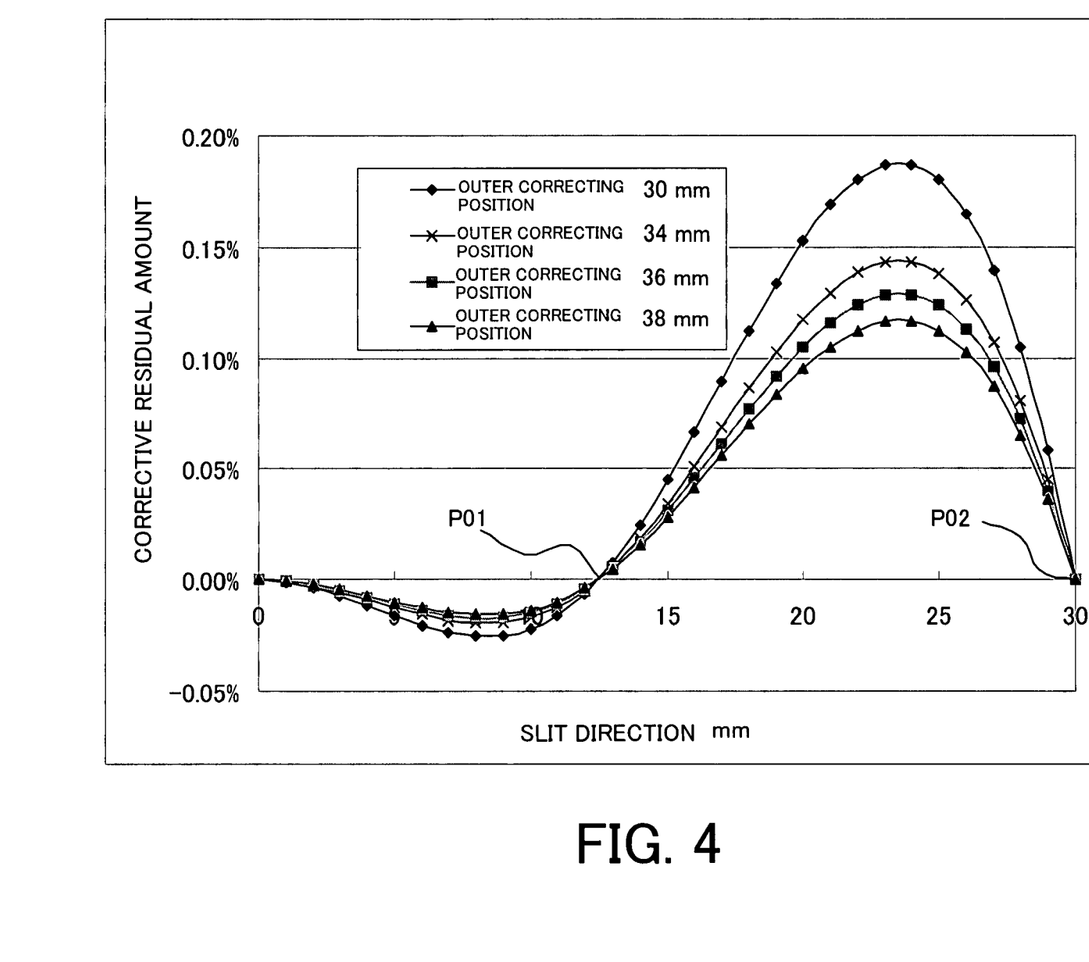
FIG. 4 is a graph showing a corrective residual amount calculated from weighting coefficients so that a corrected curve accords with an ideal curve at a correcting position and an end of an exposure area in a correction apparatus shown in FIG. 2.

FIG. 4 shows the corrective residual amount, i.e., yb−ya, as a result of the weighting coefficients $P_1$ and $P_2$ are calculated so that the corrected curve yb accords with the ideal curve ya at the inner correcting position and the end of the exposure area, for the inner correcting position $L_1$=12.5 mm, the outer correcting positions L=34 mm, 36 mm, and 38 mm, and the exposure area of 60 mm. Referring to FIG. 4, the present invention can reduce the corrective residual amount down to 0.19% to 0.12%. Here, FIG. 4 is a graph showing the corrective residual amount calculated from the weighting coefficients $P_1$ and $P_2$ so that the corrected curve yb accords with the ideal curve ya at the inner correcting position and the end of the exposure area in a correction apparatus 100 shown in FIG. 2.

Thus, the correction apparatus 100 shapes the opening in the exposure area, corrects the uneven exposure with high precision, and provides an exposure apparatus having the superior resolution and throughput.

Turning back to FIG. 1, the reticle 20 is made, for example, of quartz, on which a circuit pattern (or an image) to be transferred is formed, and is supported and driven by the reticle stage 22. Diffracted light from the reticle 20 is projected onto the object 40 via the projection optical system 30. The reticle 20 and object 40 are located in a conjugate relationship. Since the exposure apparatus 1 according this embodiment is a scanner, it transfers a pattern on the mask 20 onto the object 40 by scanning the mask 20 and object 40. If the exposure apparatus 1 is a stepper, it exposes while making the mask 20 and plate 40 still.

The reticle stage 22 supports the reticle 20, and is connected to a transport mechanism (not shown). The reticle stage 22 and the projection optical system 30 are provided on a barrel stool supported via a damper, for example, to the base-frame placed on the floor. The reticle stage 22 can use any structure known in the art. The transport mechanism (not shown) is made of a linear motor and the like, and drives the reticle stage 22 in the XY directions, thus moving the reticle 20.

The projection optical system 30 serves to project a reduced size of circuit pattern on the reticle 20 onto the object 40. The projection optical system 30 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration is available through a plurality of lens units made from glass materials having different dispersion values (Abbe values), or arrange a diffractive optical element such that it disperses in a direction opposite to that of the lens unit. Otherwise, the compensation of the chromatic aberration is done with the narrowing of spectral width of the laser. Nowadays, line-narrowed MOPA laser is one of the main stream.

The object 40 is a wafer in this embodiment, but it includes a wide range of objects to be exposed such as a liquid crystal plate and others. Photoresist is applied onto the object 40. The object 40 is mounted on the wafer stage 42.

The wafer stage 42 supports and drives the object 40. The wafer stage 42 may use any structure known in the art, and a detailed description thereof will be omitted. For example, the wafer stage 42 uses a linear motor to move the object 40 in the XYZ directions. The reticle 20 and object 40 are, for example, scanned synchronously, and the positions of the reticle stage 22 and wafer stage 42 are monitored, for example, by a laser interferometer and the like, so that both are driven at a constant speed ratio. The wafer stage 42 is installed on a stage stool supported on the floor and the like, for example, via a dumper.

In exposure, the light emitted from the light source 12, for example, Koehler-illuminates the reticle 20 via the illumination optical system 14. The light that passes the reticle 20 and reflects the reticle pattern is imaged onto the object 40 by the projection optical system 30. The correction apparatus corrects the uneven exposure, and maintains the uniform accumulated exposure dose for respective exposure areas on the object 40. Therefore, the present invention can maintain the resolution and throughput.

Figure 5:
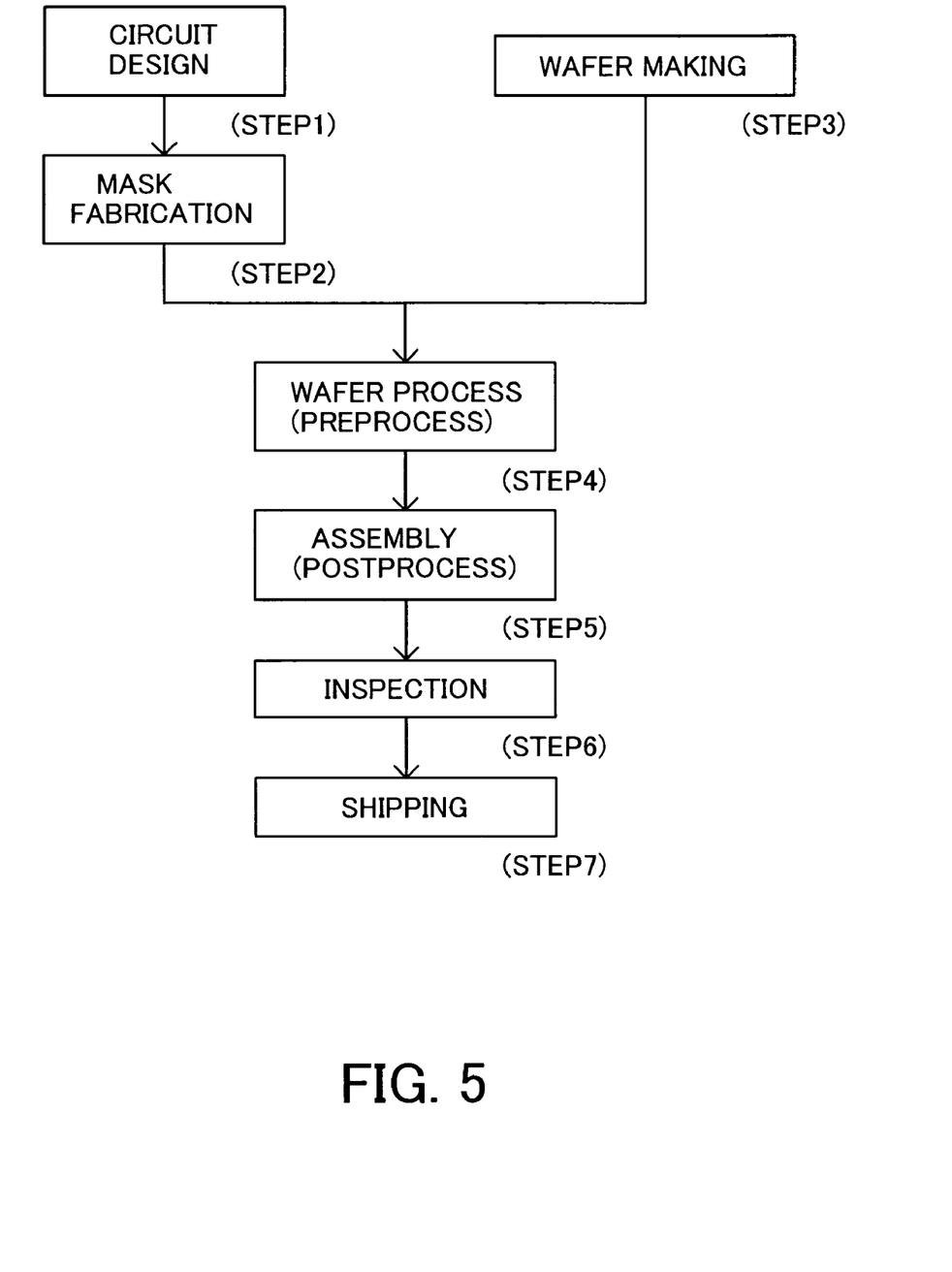
FIG. 5 is a flowchart for explaining a method for fabricating devices (semiconductor chips such as ICs, LSIs, and the like, LCDs, CCDs, etc.).
Figure 6:
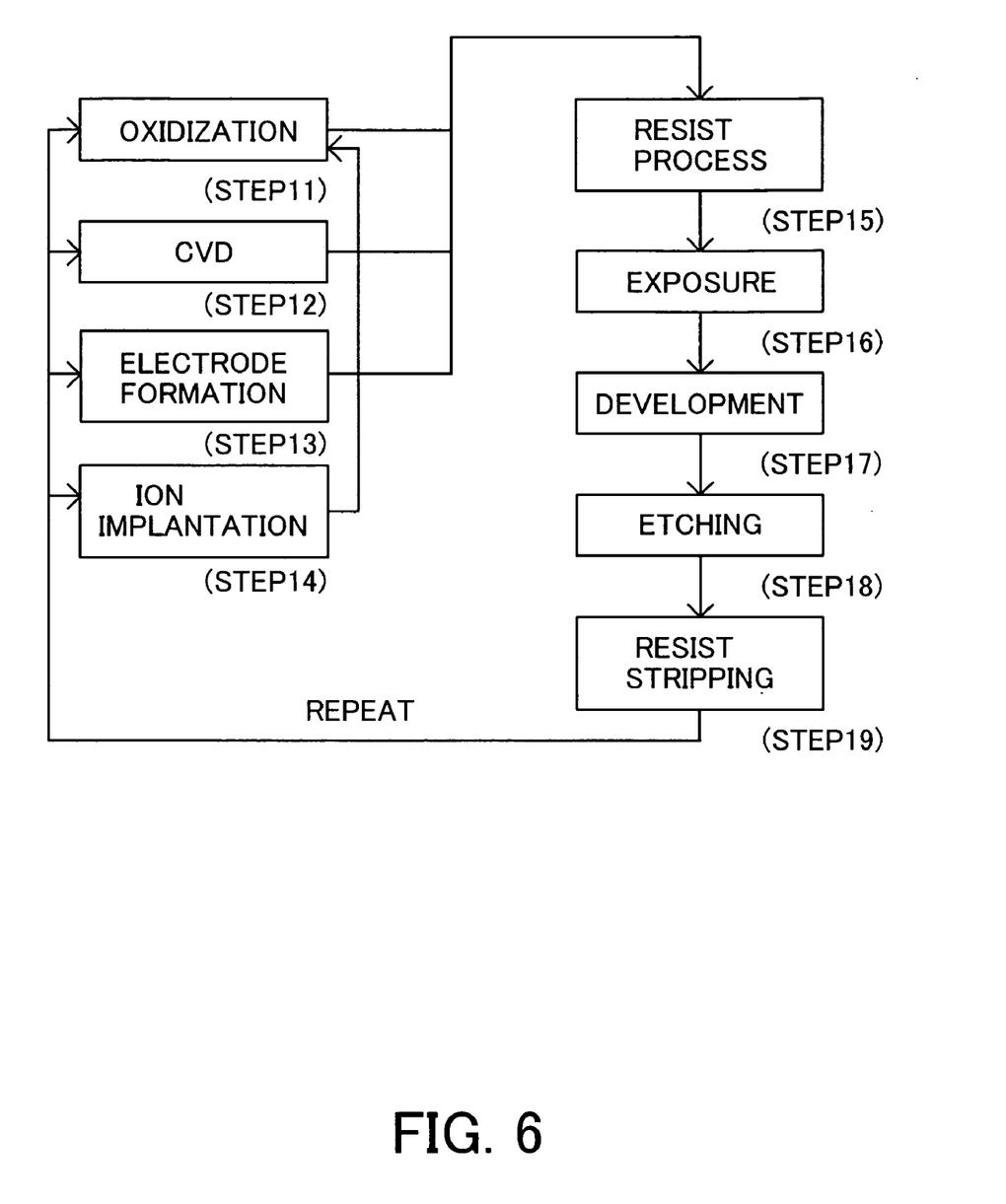
FIG. 6 is a detailed flowchart for Step 4 of wafer process shown in FIG. 5.

Referring to FIGS. 5 and 6, a description will now be given of an embodiment of a device fabricating method using the above mentioned exposure apparatus 1. FIG. 5 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 6 is a detailed flowchart of the wafer process in Step 4 shown in FIG. 5. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 1, and the devices as finished goods also constitute one aspect of the present invention.

The present invention shapes the opening in the exposure area, corrects the uneven exposure with high precision, and provides an exposure apparatus having the superior resolution and throughput.

Further, the present invention is not limited to these preferred embodiments, and various variations and modifications may be made without departing from the scope of the present invention.

This application claims foreign priority benefits based on Japanese Patent Application No. 2003-409962, filed on Dec. 9, 2003, which is hereby incorporated by reference herein in its entirety as if fully set forth herein.

What is claimed is:

1. A scanning exposure apparatus for transferring a pattern of an original onto a substrate, said apparatus comprising:

a flexible blade, arranged between a light source and the original, for defining a width of an illumination area on the original in a scan direction;

a first drive system to move said blade in the scan direction at a first position in the illumination area in an orthogonal direction that is orthogonal to the scan direction; and a second drive system to move said blade in the scan direction at a second position outside the illumination area in the orthogonal direction, wherein the first and second positions are arranged so that a position of said blade in the scan direction is maintained still within a predetermined tolerance, at an end position of the illumination area in the orthogonal direction.

2. An exposure apparatus according to claim 1, wherein a deviation between the end position and a position of said blade in the orthogonal direction, at which said blade is still, is not greater than 5% of a width of the illumination area in the orthogonal direction.

3. An exposure apparatus according to claim 2, wherein the deviation is not greater than 2.8% of the width.

4. An exposure apparatus according to claim 1, wherein said first drive system moves said blade so that nonuniformity of exposure dose on the substrate reduces.

5. An exposure apparatus according to claim 1, wherein the illumination area has an arc shape.

6. An exposure apparatus according to claim 1, further comprising a fixation system for fixing said blade at a position of a center in the illumination area in the orthogonal direction.

7. An exposure apparatus according to claim 6, wherein there are a pair of said first drive systems and a pair of said second drive systems symmetrically with respect to the center in the orthogonal direction.

8. An exposure apparatus according to claim 1, wherein the first and second positions satisfy the following equations, where W is a width of the illumination area in the orthogonal direction, L1 is a distance from a center of the illumination area to the first position, and L is a distance from the center to the second position:

$$0.54W \leq L \leq 0.66W; \text{ and}$$

$$0.20W \leq L1 \leq 0.25W.$$

9. An exposure apparatus according to claim 1, wherein the following equation is satisfied, where Q (%) is a tolerance of nonuniformity of an exposure dose on the substrate, N is number of times said first drive system drives, and U (mm) is a deviation amount between the end position and a position of said blade in the orthogonal direction at which said blade is still:

$$Q = 7 \times (0.016 \times U^2 - 0.01 \times U)^{(N-1)/2}.$$

10. A device manufacturing method comprising steps of:

transferring a pattern of an original to a substrate using a scanning exposure apparatus as recited in claim 1; and developing the substrate to which the pattern has been transferred.

* * * * *